(12) United States Patent
Yang et al.

(10) Patent No.: US 10,754,459 B2
(45) Date of Patent: Aug. 25, 2020

(54) IN-CELL TRANSPARENT TOUCH DISPLAY PANEL, MANUFACTURING METHOD THEREOF

(71) Applicant: BOE TECHNOLOGY GROUP CO., LTD., Beijing (CN)

(72) Inventors: Shengji Yang, Beijing (CN); Xue Dong, Beijing (CN); Jing Lv, Beijing (CN); Xiaochuan Chen, Beijing (CN); Dongni Liu, Beijing (CN); Lei Wang, Beijing (CN); Pengcheng Lu, Beijing (CN); Li Xiao, Beijing (CN); Han Yue, Beijing (CN); Jie Fu, Beijing (CN); Wenqing Zhao, Beijing (CN); Yafeng Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 211 days.

(21) Appl. No.: 15/750,924

(22) PCT Filed: Aug. 8, 2017

(86) PCT No.: PCT/CN2017/096393
§ 371 (c)(1),
(2) Date: Feb. 7, 2018

(87) PCT Pub. No.: WO2018/032996
PCT Pub. Date: Feb. 22, 2018

(65) Prior Publication Data
US 2020/0004363 A1    Jan. 2, 2020

(30) Foreign Application Priority Data

Aug. 19, 2016 (CN) .......................... 2016 1 0698497

(51) Int. Cl.
*G06F 3/041* (2006.01)
*G06F 3/044* (2006.01)

(52) U.S. Cl.
CPC ............ *G06F 3/0412* (2013.01); *G06F 3/044* (2013.01); *G06F 3/0416* (2013.01); *G06F 2203/04103* (2013.01)

(58) Field of Classification Search
CPC ................. G06F 3/0412; G06F 3/0416; G06F 2203/04103
See application file for complete search history.

(56) References Cited

U.S. PATENT DOCUMENTS

2006/0249732 A1\* 11/2006 Shirasaki ............ H01L 27/3244
257/59
2010/0245255 A1\* 9/2010 VanDuyn .............. G06F 3/0412
345/173

(Continued)

FOREIGN PATENT DOCUMENTS

| CN | 103984442 A | 8/2014 |
| CN | 104393021 A | 3/2015 |

(Continued)

OTHER PUBLICATIONS

First Office Action for Chinese Patent Application No. 201610698497.8 dated Aug. 13, 2018.

(Continued)

*Primary Examiner* — Stephen G Sherman
(74) *Attorney, Agent, or Firm* — Calfee, Halter & Griswold LLP (57) ABSTRACT

An in-cell transparent touch display panel, manufacturing method and driving method thereof, which relates to the technical field of display is disclosed. The transparent touch display panel includes a first electrode and a pixel defining structure on a transparent substrate, the first electrode extending along a first direction and the pixel defining (Continued)

structure defining a plurality of pixel regions and touch electrode regions; an organic electroluminescent layer in the pixel regions, a second electrode arranged on the organic electroluminescent layer and in the pixel regions, the second electrodes extending along a second direction; and a plurality of first touch electrodes along the first direction and a plurality of second touch electrodes along the second direction and in the touch electrode regions. The first electrodes, second electrodes, first touch electrodes and second touch electrodes are all transparent electrodes, and the first direction intersects with the second direction.

15 Claims, 5 Drawing Sheets

(56) References Cited

U.S. PATENT DOCUMENTS

| | | | | |
|---|---|---|---|---|
| 2015/0153885 A1* | 6/2015 | Endo | ............... | G06F 3/045 |
| | | | | 345/174 |
| 2015/0205440 A1* | 7/2015 | Yang | ............... | G06F 3/0412 |
| | | | | 345/174 |
| 2015/0331508 A1 | 11/2015 | Nho et al. | | |
| 2016/0034072 A1 | 2/2016 | Yang et al. | | |
| 2017/0010734 A1 | 1/2017 | Liu et al. | | |
| 2017/0199605 A1* | 7/2017 | Li | ............... | G06F 3/0412 |
| 2017/0277307 A1 | 9/2017 | Xu et al. | | |
| 2017/0344146 A1* | 11/2017 | Sun | ............... | G06F 3/044 |

FOREIGN PATENT DOCUMENTS

| | | |
|---|---|---|
| CN | 104978066 A | 10/2015 |
| CN | 105159485 A | 12/2015 |
| CN | 105679805 A | 6/2016 |
| CN | 106354302 A | 1/2017 |
| KR | 20140039470 A | 4/2014 |

OTHER PUBLICATIONS

The ISR for the international patent application PCT/CN2017/096393 dated Nov. 15, 2017.

* cited by examiner

IN-CELL TRANSPARENT TOUCH DISPLAY PANEL, MANUFACTURING METHOD THEREOF

CROSS REFERENCE TO RELATED APPLICATION

This application is the U.S. national phase entry of PCT/CN2017/096393, with an international filling date of Aug. 8, 2017, which claims priority to the patent application No. 201610698497.8 filed with the Patent Office of the People's Republic of China on Aug. 19, 2016, the disclosure of which is incorporated herein by reference.

TECHNICAL FIELD

The present disclosure relates to the technical field of display, in particular to an in-cell transparent touch display panel as well as manufacturing method and driving method thereto.

BACKGROUND

Transparent displays, as a new type of display device, have been gaining more and more attention from users, and currently they are also one of the hotspots in the field of flat panel display. By means of a transparent display device, a user can see objects behind the transparent display device while seeing images displayed on the display device, which has greatly expanded the scope and occasion for application of display. Currently, transparent display devices have been applied to many situations such as display cabinets, display windows, etc.

The transparent display technology at present mainly achieves the object of transparent display through increasing transmissivity of the display device. The Liquid Crystal Display (LCD) has relatively low overall transmissivity owing to its structure. Specifically, the two polarizers and the color filter of the LCD greatly reduce the overall transmissivity of the display device, so the LCD usually has a transmissivity of less than 15% and thus has poor transparency. Compared to the LCD, manufacturing process for the Organic Light-Emitting Diode (OLED) display is relatively simpler, meanwhile, the OLED display has good transmissivity, so the OLED display is one of research emphases in the field of transparent display device. OLED display devices include Active Matrix Organic Light-Emitting Diode (AMOLED) display and Passive Matrix Organic Light-Emitting Diode (PMOLED) display.

In addition, in order to further realize human-computer interaction and improve user experiences, touch display panels have been developed, and in-cell touch display panel is the mainstream of the touch display technology. Currently, the in-cell touch technology has been successfully applied to LCD displays, but due to restrictions of technology and yield, the in-cell touch display technology has not been widely used in OLED displays yet.

SUMMARY

Embodiments of the disclosure provide an in-cell transparent touch display panel, as well as manufacturing method and driving method thereto.

In an aspect, an embodiment of the present disclosure provides an in-cell transparent touch display panel, which comprises a plurality of first electrodes extending along a first direction on a transparent substrate, a pixel defining structure on the first electrodes, the pixel defining structure defining a plurality of pixel regions and a plurality of touch electrode regions on the transparent substrate, and adjacent touch electrode regions having at least one pixel region therebetween, an organic electroluminescent layer in the pixel regions, and a second electrode arranged on the organic electroluminescent layer and in the pixel regions, the second electrode extending along a second direction, and a plurality of first touch electrodes extending along the first direction and a plurality of second touch electrodes in the touch electrode regions and extending along the second direction. Each of the first electrodes, the second electrode, the first touch electrodes and the second touch electrodes is transparent, and the first direction intersects with the second direction.

In some embodiments, the pixel defining structure includes a plurality of resin strips each extending along the second direction.

In some embodiments, the in-cell transparent touch display panel further comprises barriers between any two of the second electrodes and the second touch electrodes that are adjacent to each other, and each barrier extends on the resin strip along the second direction, so as to isolate the adjacent second electrodes and isolate the adjacent second electrode and second touch electrode.

In some embodiments, a thickness of the barrier in a vertical direction perpendicular to the transparent substrate is greater than a thickness of each of the second electrode and the second touch electrode.

In some embodiments, a cross-section of the barrier along a direction axially perpendicular to the barrier is a trapezoid whose first base is greater than second base thereof, and the barrier contacts the pixel defining structure via the second base.

In some embodiments, the barrier is made from negative photoresist material.

Alternatively, in some embodiments, the barrier is made of resin material and is formed as an integral with the pixel defining structure.

In some embodiments, one of the first electrode and the second electrode is an anode and the other is a cathode, one of the first touch electrode and the second touch electrode is a touch drive electrode and the other is a touch sensing electrode.

In some embodiments, the first touch electrodes and the first electrodes are arranged in a same layer.

In some embodiments, the second touch electrodes and the second electrode are arranged in a same layer.

In some embodiments, the in-cell transparent touch display panel further comprises a block electrode arranged in a pixel region neighboring the touch electrode region, the block electrode being in a same layer as the second electrode.

In some embodiments, the block electrode is independent from the second electrode, and an orthographic projection of the block electrode on the transparent substrate overlaps with the first touch electrode.

In some embodiments, the second touch electrode includes an overlap portion overlapping with the first touch electrode, and a length of the overlap portion along the first direction is smaller than that of other portions of the second touch electrode along the first direction.

In some embodiments, the in-cell transparent touch display panel further comprises a silver material layer on the first electrodes, which is disposed in an overlapping region between the first electrode and the second electrode.

In some embodiments, the in-cell transparent touch display panel further comprises a protective layer covering the silver material layer.

Another embodiment of the disclosure provides a method for manufacturing an in-cell transparent touch display panel, the method comprising: forming a plurality of first electrodes and a pixel defining structure on a transparent substrate, the first electrodes extending along a first direction, the pixel defining structure defining a plurality of pixel regions and a plurality of touch electrode regions on the transparent substrate, and adjacent touch electrode regions having at least one pixel region therebetween; forming an organic electroluminescent layer in the pixel regions; forming a second electrode on the organic electroluminescent layer in the pixel regions, the second electrode extending along a second direction; forming a plurality of first touch electrodes extending along the first direction and forming a plurality of second touch electrodes extending along the second direction in the touch electrode regions. Each of the first electrodes, the second electrode, the first touch electrodes and the second touch electrodes is made of transparent material, and the first direction intersects with the second direction.

In some embodiments, the first electrodes and the first touch electrodes are made through a same one patterning process.

In some embodiments, forming the pixel defining structure on the first electrodes comprises forming a plurality of resin strips that are independent from one another along the second direction.

In some embodiments, the method further comprises forming a negative photoresist film layer on the transparent substrate on which the pixel defining structure is formed; arranging a mask above the negative photoresist film layer and exposing negative photoresist in other regions than those corresponding to the pixel defining structure; and developing the exposed negative photoresist film layer to form barriers, wherein the barriers are located between adjacent second electrodes and between adjacent second electrode and second touch electrode so as to isolate the adjacent second electrodes and isolate the adjacent second electrode and second touch electrode.

In some embodiments, forming the plurality of second electrodes on the organic electroluminescent layer in the pixel regions and forming the plurality of second touch electrodes in the touch electrode regions comprise evaporating an electrode material film layer on the transparent substrate on which the barriers are formed, so as to form the plurality of second electrodes and the plurality of second touch electrodes.

In some embodiments, the method further comprises forming a block electrode in a pixel region adjacent to the touch electrode regions while forming the plurality of second electrodes and the plurality of second touch electrodes.

In some embodiments, the method further comprises fabricating a silver material layer in an overlapping region between the first electrode and the second electrode.

In some embodiments, the method further comprises fabricating a protective layer covering the silver material layer.

A further embodiment of the disclosure provides a method for driving the in-cell transparent touch display panel according to any one of the forgoing embodiments, the method comprises dividing one frame time into a display phase and a touch phase during a touch display process; providing an anode drive signal to the anode electrode and providing a cathode drive signal to the cathode electrode in the display phase; and providing a touch drive signal to the touch drive electrode in the touch phase.

BRIEF DESCRIPTION OF DRAWINGS

In order to illustrate the technical solutions in embodiments of the present disclosure more clearly, drawings necessary for the descriptions of the embodiments will be briefly introduced below. The drawings mentioned below are merely some of the embodiments of the present disclosure, and those skilled in the art can obtain other drawings from these drawings without any inventive efforts.

DETAILED DESCRIPTION OF EMBODIMENTS

Technical solutions in embodiments of the present disclosure will be described clearly and completely below with reference to the drawings. The described embodiments are merely some, instead of all of the embodiments of the invention. On the basis of the embodiments described herein, all other embodiments that can be obtained by those skilled in the art without any creative efforts shall fall into the scope of the invention.

It shall be noted that, in order to facilitate clear description of the technical solutions in embodiments of the disclosure, such wordings as "first" and "second" are used in the embodiments to differentiate the same or similar items having substantially the same function or effect, but those skilled in the art shall understand that such wordings do not intend to limit the sequence or number.

Figure 1:
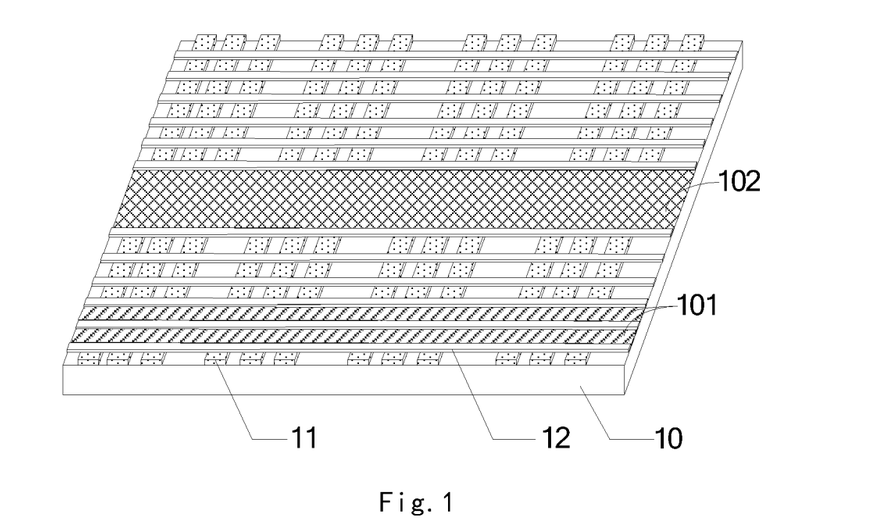
FIG. 1 is a schematic structural view of an in-cell transparent touch display panel provided in an embodiment of the present disclosure.

An embodiment of the present disclosure provides an in-cell transparent touch display panel. Referring to FIG. 1, the in-cell transparent touch display panel comprises a plurality of first electrodes 11 on a transparent substrate 10, which extend along a first direction; a pixel defining structure 12 on the first electrodes 11, the pixel defining structure 12 defines a plurality of pixel regions 101 and a plurality of touch electrode regions 102 on the transparent substrate 10, and at least one pixel region 101 existing between adjacent touch electrode regions 102.

That the first electrode 11 extends along the first direction means a length direction of the first electrodes 11 is in the first direction. In addition, since the plurality of first electrodes all extend along the first direction, they are in parallel with each other in the first direction. As an example shown in FIG. 1, the first electrodes 11 can be regular strip electrodes. Of course, on the basis of the embodiment of the present disclosure, those skilled in the art can also design the first electrodes to have irregular shapes. For example, the first electrode may have different sizes at different positions. But these belong to reasonable variations of the embodiment of the present disclosure, and thus should fall into the protection scope of the present invention. Furthermore, according to the above description about the pixel defining structure, the pixel defining structure in the embodiment of the present disclosure functions to divide the transparent substrate into multiple regions, so as to provide respective layer structures in different regions. In some embodiments, the pixel defining structure includes a plurality of resin strips 12, each resin strip extending along a second direction.

It shall be noted that, when making the in-cell transparent touch display panel, those skilled in the art can set the number of pixel regions 101 between adjacent touch electrode regions 102 according to sizes of the pixel regions 101 and the actually required density of the touch sensing electrodes. The smaller the required density of the touch sensing electrodes, the larger the number of pixel regions 101 included between adjacent touch electrode regions 102, and the larger the required density of the touch sensing electrodes, the smaller the number of pixel regions 101 included between adjacent touch electrode regions 102. The number of pixel regions 101 included between adjacent touch electrode regions 102 is not limited by the embodiment of the present disclosure.

In an example, prior to forming the first electrodes 11 and the pixel defining structure 12 on the transparent substrate 10, a passivation layer may be made first on the transparent display panel 10, for buffering and flattening the first electrodes 11 and the pixel defining structure 12.

Figure 2:
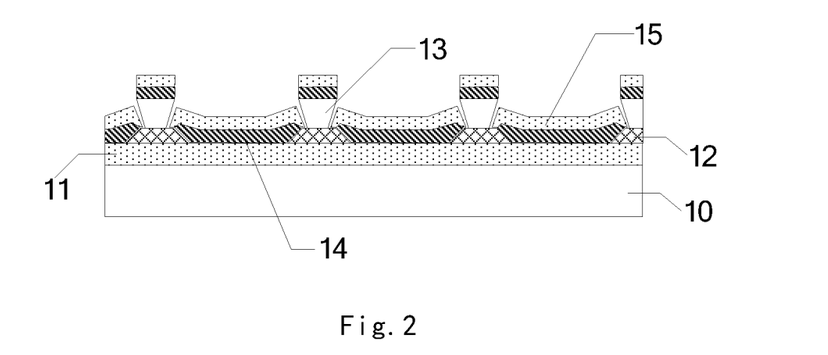
FIG. 2 is a partial sectional view of the in-cell transparent touch display panel shown in FIG. 1 as provided in an embodiment of the present disclosure.

Further, referring to FIG. 2, which is a partial sectional view of the in-cell transparent touch display panel shown in FIG. 1 as provided in an embodiment of the present disclosure. It can be seen from FIG. 2 that, the in-cell transparent touch display panel further comprises a barrier 13 on each of the resin strips 12 in the pixel defining structure, an organic electroluminescent layer 14 in the pixel region 101, and a second electrode 15 arranged on the organic electroluminescent layer 14 and in the pixel region 101, the second electrode 15 extending along the second direction.

Figure 3:
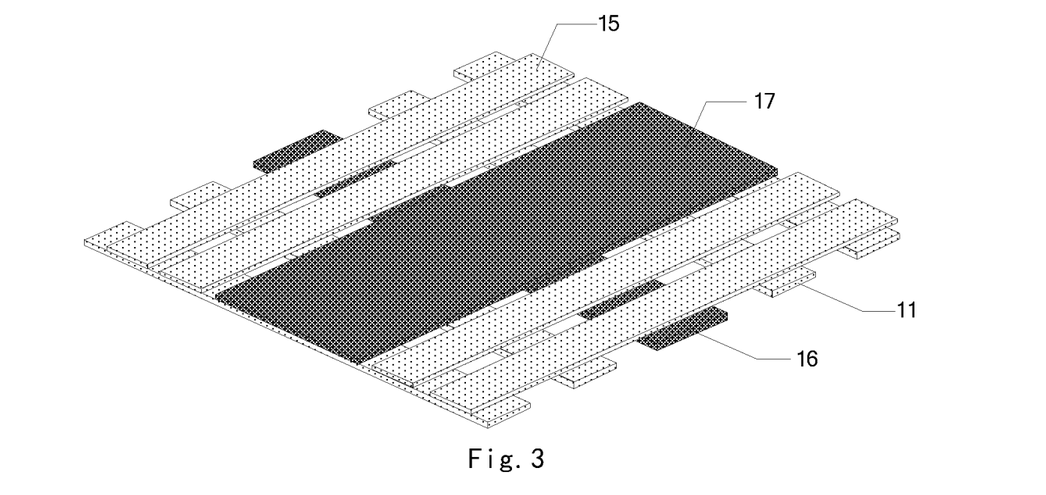
FIG. 3 is a schematic structural view of the in-cell transparent touch display panel provided in a further embodiment of the present disclosure.

Further, referring to FIG. 3, the in-cell transparent touch display panel further comprises a plurality of first touch electrodes 16 extending along the first direction and a plurality of second touch electrodes 17 in the touch electrode regions 102 and extending along the second direction.

It shall be noted that, FIG. 3 illustrates an example that the first touch electrode 16 and the first electrode 11 are in the same layer of the in-cell transparent touch display panel while the second touch electrodes 17 and the second electrodes 15 are in the same layer of the in-cell transparent touch display panel, but the embodiment of the present invention is not so limited. When manufacturing the in-cell transparent touch display panel provided in the above embodiment, those skilled in the art can set the positions of the first touch electrodes and the second touch electrodes according to actual needs. For example, the first touch electrodes and the first electrodes are arranged in different layers, as another example, the second touch electrodes and the second electrodes are arranged in different layers.

The first electrodes 11, second electrodes 15, first touch electrodes 16 and second touch electrodes 17 are all transparent electrodes, and the first direction intersects with the second direction. For example, the first direction and the second direction can be substantially perpendicular to each other.

The principle of the in-cell transparent touch display panel provided in the above embodiment will be described below.

Figure 4:
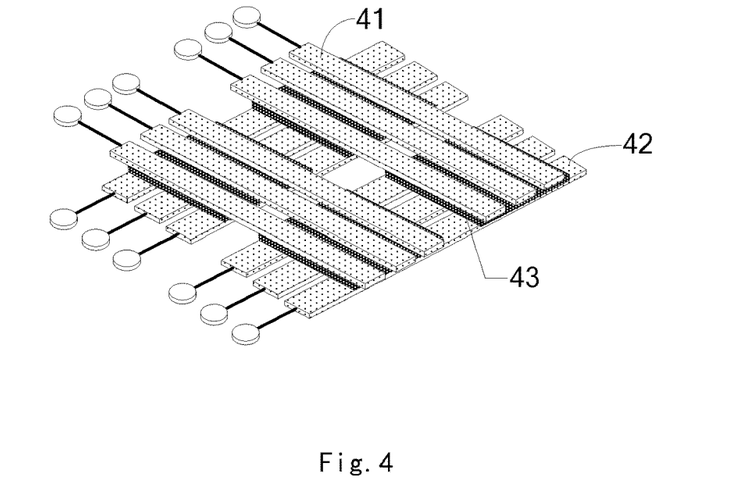
FIG. 4 is a schematic partial structural view of a PMOLED display panel provided in an embodiment of the present disclosure.

Referring to FIG. 4, which is a schematic local structural view of a PMOLED display panel provided in an embodiment of the present disclosure. Cathodes 41 and anodes 42 thereof extend to directions that are perpendicular to each other, respectively, and organic electroluminescent layers 43 are provided between the cathodes 41 and the anodes 42. During displaying, a DC voltage is applied to the anodes 41 line by line and gray-scale voltages are applied to the anodes 42 simultaneously. By controlling voltages across the organic electroluminescent layers 43 in overlapping regions of the cathodes and the anodes, luminance of the organic electroluminescent layers can be controlled, thereby realizing displaying of the PMOLED display panel.

Figure 5:
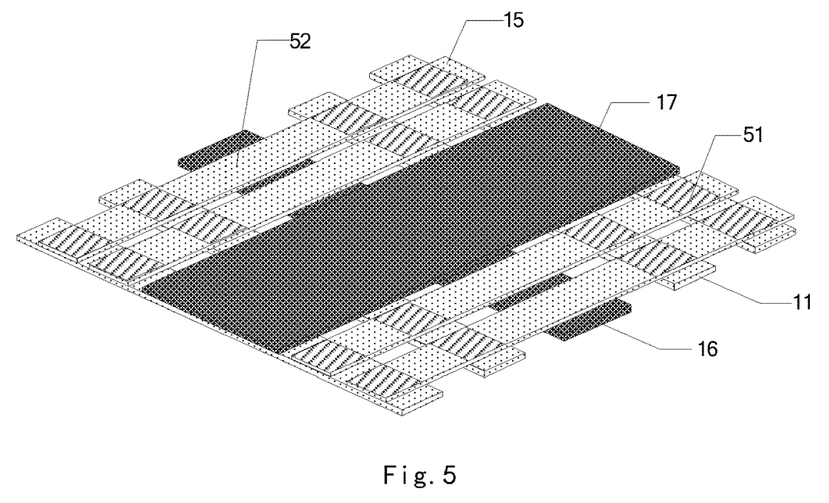
FIG. 5 is a view for illustrating positions of the display regions and light-transmissive regions of the in-cell transparent touch display panel provided in an embodiment of the present disclosure.

Referring to FIG. 5, the first electrodes 11 extend along the first direction, the pixel regions 101 extend along the second direction, and the second electrodes 15 are in the pixel regions 101, so the overlapping regions of the first electrodes 11 and the second electrodes 15 are display regions 51 of the in-cell transparent touch display panel, and by controlling voltages applied to the first electrodes 11 and the second electrodes 15, luminance of the display regions 51 can be controlled. In addition, organic electroluminescent layers in other regions than the display regions 51 do not emit light, and the first electrodes 11, the second electrodes 15, the first touch electrodes 16 and the second touch electrodes 17 are all transparent electrodes, so other regions than the display regions 51 are light-transmissive regions 52 of the display panel.

The in-cell transparent touch control display panel provided in an embodiment of the present disclosure comprises a plurality of first electrodes extending along a first direction and a pixel defining structure on a transparent substrate, the pixel defining structure defining a plurality of pixel regions and a plurality of touch electrode regions on the transparent substrate. At least one pixel region exists between adjacent touch electrode regions. The in-cell transparent touch display panel may further comprise barriers on the pixel defining structure, organic electroluminescent layers in the pixel regions and the touch electrode regions, and second electrodes arranged on the organic electroluminescent layers and in the pixel regions, the second electrodes extending along a second direction, and the first direction intersecting with the second direction. In this way, the first electrode and the second electrode have an overlapping region, thus the organic electroluminescent layers in the overlapping region can be driven for emitting light and displaying. In addition, the in-cell transparent touch display panel may further comprise a plurality of first touch electrodes extending along the first direction and a plurality of second touch electrodes in the touch electrode regions and extending along the second direction, by means of which the touch control for the display panel can be achieved. Further, the first electrodes, the second electrodes, the first touch electrodes and the second touch electrodes are all transparent electrodes, so all other regions than the overlapping regions of the first electrodes and the second electrodes can be used as light transmissive regions, i.e. the display panel provided in the embodiment of the present disclosure can be used as a transparent display panel. Hence, the embodiment of the present disclosure can integrate the in-cell touch technology into transparent OLED display panels.

In some embodiments, the first electrodes 11 are anodes, and the second electrodes 15 are cathodes; alternatively, the first electrodes 11 are cathodes and the second electrodes 15 are anodes. The first touch electrodes 16 are touch drive electrodes, and the second touch electrodes 17 are touch sensing electrodes; alternatively, the first touch electrodes 16 are touch sensing electrodes and the second touch electrodes 17 are touch drive electrodes.

If the first electrodes 11 are anodes and the second electrodes 15 are cathodes, at the time of driving, DC voltages are applied to the second electrodes 15 line by line and gray-scale voltages are applied to all first electrodes 11. In case the first electrodes 11 are cathodes and the second electrodes 15 are anodes, at the time of driving, DC voltages are applied to the first electrodes 11 line by line and gray-scale voltages are applied to all second electrodes 15. That is, configurations between the first electrodes, the second electrodes, and the anodes, cathodes of the PMOLED display device are irrelevant to specific structures of the drive electrodes, instead, they are determined by the drive signals applied to the electrodes. Likewise, configurations between the first touch electrodes, the second touch electrodes and the touch sensing electrodes, the touch drive electrodes of the PMOLED display device are irrelevant to specific structures of the touch drive electrodes or touch sensing electrodes, but they are determined by the drive signals applied to the electrodes.

In some embodiments, referring to FIG. 3, the first touch electrodes 16 and the first electrodes 11 are arranged in the same layer. That is, the first touch electrodes 16 and the first electrodes 11 are made of the same layer of electrode material by means of the same one patterning process. If the first touch electrodes 16 are to be formed in a different layer from the first electrodes 11, then the first touch electrodes 16 and the first electrodes 11 need to be made respectively through two patterning processes. Therefore, forming the first touch electrodes 16 and the first electrodes 11 in the same layer can save one patterning process, thereby simplifying the process for manufacturing the in-cell transparent touch display panel as provided in the above embodiment.

In some embodiments, as shown in FIG. 3, the second touch electrodes 17 and the second electrodes 15 are in the same layer. Likewise, arranging the second touch electrodes 17 and the second electrodes 15 in the same layer can simplify the process for manufacturing the in-cell transparent touch display panel as provided in the above embodiment.

In an embodiment of the present disclosure, the barrier may be between adjacent second electrodes and between adjacent second electrode and second touch electrode, so as to isolate the adjacent second electrodes or to isolate the adjacent second electrode and second touch electrode. That is to say, there may exist a barrier between any two adjacent second electrodes, and a barrier may also be present between a second electrode and a second touch electrode that are adjacent to each other. A thickness of the barrier in a vertical direction perpendicular to the transparent substrate is greater than a thickness of each of the second electrode and the second touch electrode.

Figure 6:
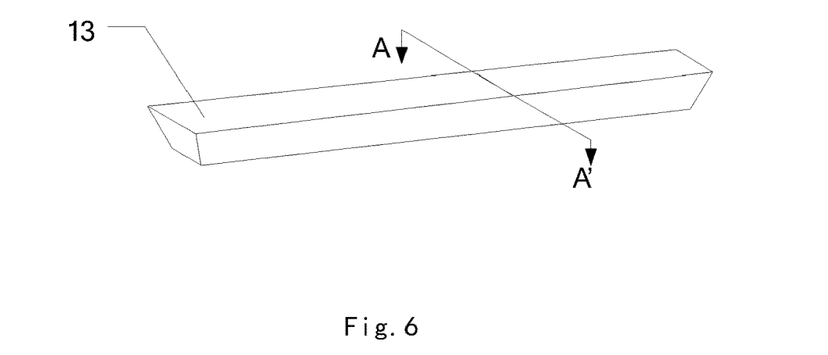
FIG. 6 is a schematic structural view of a barrier provided in an embodiment of the present disclosure.
Figure 7:
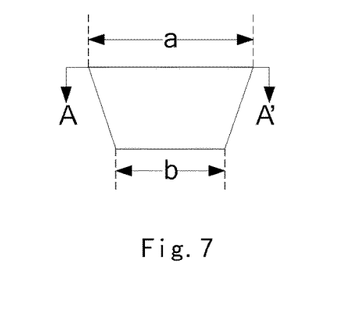
FIG. 7 is a sectional view of a barrier provided in an embodiment of the present disclosure.

Further, reference is made to FIGS. 6 and 7, in which FIG. 7 is a sectional view along a transversal A-A' as shown in FIG. 6. Along a direction axially perpendicular to the barrier 13, a cross-section of the barrier 13 is a trapezoid whose first base a is greater than second base b, and the barrier contacts the pixel defining structure via the second base b.

Namely, in the embodiment, a cross-section of the barrier is a trapezoid whose upper base is greater than lower base. In this way, in the case where the second touch electrodes and the second electrodes are in the same layer, electrode material layers can be directly evaporated on the electroluminescent layers, and adjacent second electrodes, adjacent touch sensing electrode and second electrode can be isolated by the barriers, thus structure of the second electrodes and second touch electrodes in the above embodiment can be made through one evaporation, as a result, the embodiment of the present disclosure can further simplify the manufacturing process of the in-cell transparent touch display panel.

In some embodiments, the barrier in the above embodiment is made of negative photoresist materials. Alternatively, in other embodiments, the barriers can be made of resin materials and can be formed as an integral with the pixel defining structure.

Figure 8:
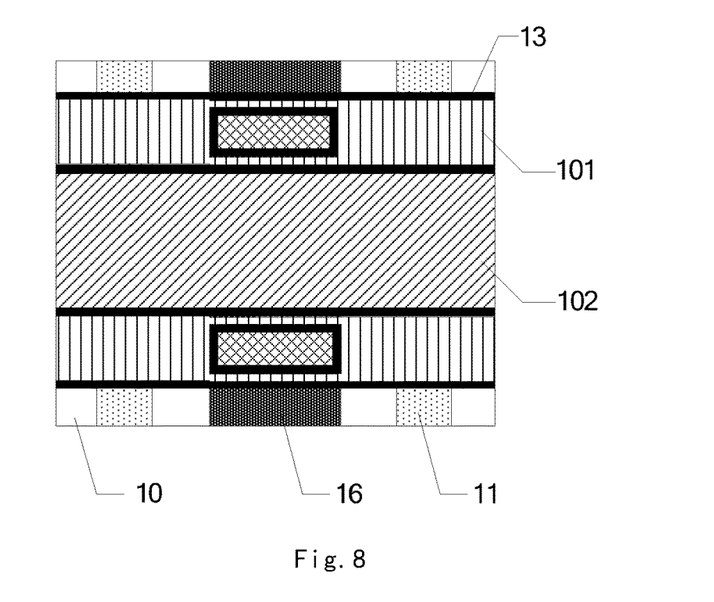
FIG. 8 is a schematic view for illustrating a position of block electrode provided in an embodiment of the present disclosure.
Figure 9:
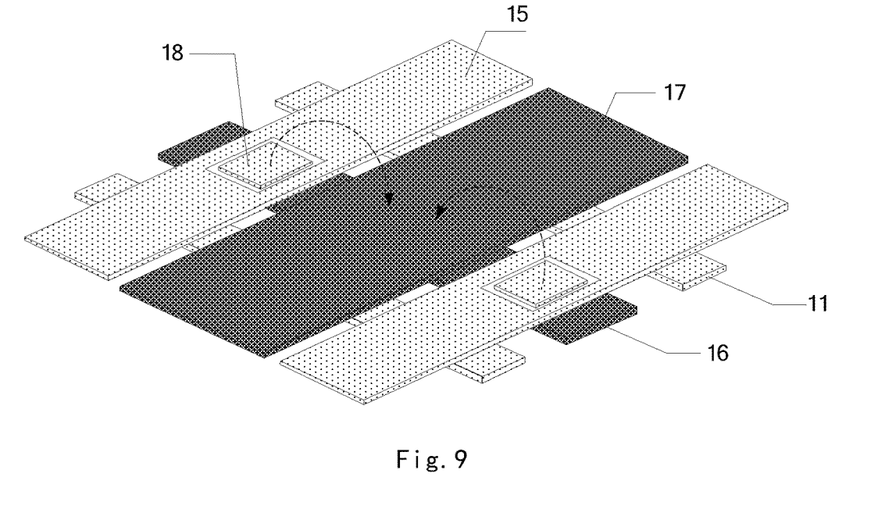
FIG. 9 is a schematic structural view for illustrating the block electrode, first electrodes, second electrodes, first touch electrodes and second touch electrodes included in the display panel provided in an embodiment of the present disclosure.

Further, referring to FIGS. 8 and 9, the in-cell transparent touch display panel further comprises block electrodes 18 provided in pixel regions 101 neighboring the touch electrode regions 102, and the block electrodes 18 are arranged in the same layer as the second electrodes 15.

In an embodiment, the block electrode 18 is independent from the second electrode 15, and an orthographic projection of the block electrode on the transparent substrate overlaps with the first touch electrode 16. The block electrode 18 may be insulated from the second electrode 15 and the second touch electrode 17. For example, they can be isolated by materials (e.g. resin) for forming the barriers, and the block electrode 18 only contacts the electroluminescent layer, so the block electrode 18 is in a floating state. In addition, the fact that the orthographic projection of the block electrode on the transparent substrate overlaps with the first touch electrode 16 means that the block electrode 18 faces the first touch electrode 16, so the block electrode 18 and the first touch electrode 16 can form a plate capacitor. Hence, by means of the bootstrap of the plate capacitor, touch drive signals applied to the first touch electrode 16 during the touch drive process are coupled to (indicated by the dashed arrows in FIG. 9) the second touch electrode 17 neighboring the block electrode 18, thereby further realizing release of the touch drive signals.

Figure 10:
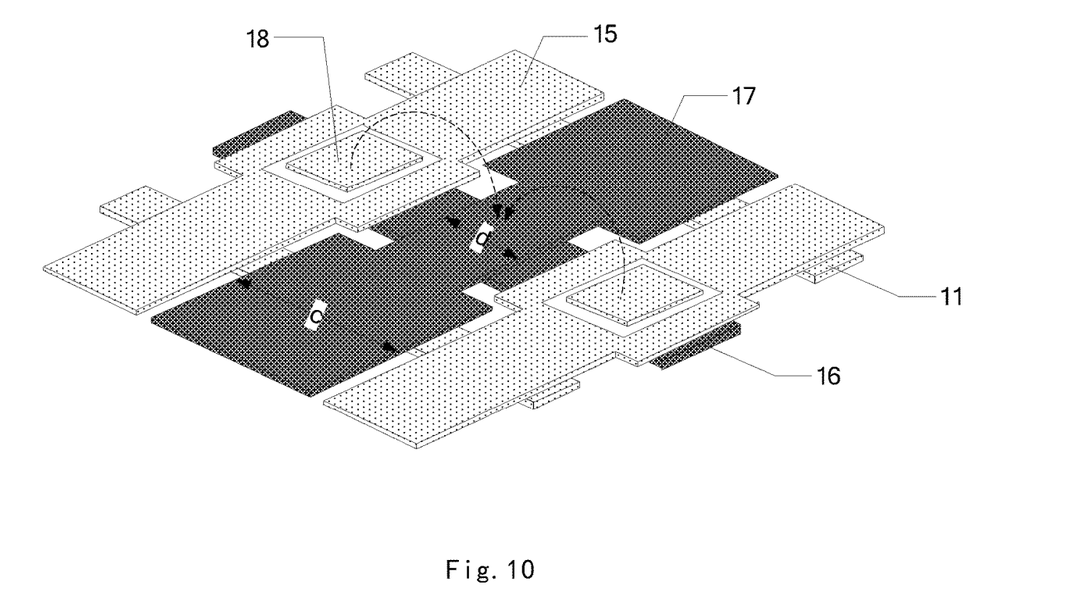
FIG. 10 is schematic structural view for illustrating the block electrodes, first electrodes, second electrodes, first touch electrodes and second touch electrodes included in the display panel provided in another embodiment of the present disclosure.

In some embodiments, referring to FIG. 10, the second touch electrode 17 includes an overlap portion overlapping with the first touch electrode 16, a length d of the overlap portion along the first direction is smaller than a length c of other portions of the second touch electrode along the first direction.

By making the first length c greater than the second length d, an overlap area between the first touch electrode and the second touch electrode can be reduced, thereby reducing an overlap area of the plate capacitor formed by the first touch electrode and the second touch electrode, reducing the parasitic coupling capacitance of the touch drive electrode and the touch sensing electrode, which in turn increases intensity and sensitivity of the touch signals. In addition, when the second touch electrodes and the second electrodes are arranged in the same layer, the above design can also help to increase the total surface area of the second electrodes, thereby ensuring voltage drop (IR Drop) of the second electrodes.

In some embodiments, the in-cell transparent touch display panel further comprises a silver material layer disposed in an overlapping region of the first electrode 11 and the second electrode 15 and on the first electrode 11.

Referring to FIG. 5, the overlapping region 51 of the first electrode 11 and the second electrode 15 corresponds to a display region of the in-cell transparent touch display panel provided in the embodiment of the present disclosure, and in this embodiment of the present disclosure, a silver material layer on the first electrode 11 are further provided in this region, so light-transmittance of the display region can be reduced by means of the silver material, thereby improving display effects.

In some embodiments, the in-cell transparent touch display panel provided in the embodiment of the present disclosure may further comprise a protective layer covering the silver material layer. The solver material can be protected by the protective layer disposed thereon, accordingly, reliability of the in-cell transparent touch display panel can be improved.

Still another embodiment of the present disclosure provides a method for manufacturing an in-cell transparent touch display panel, which can be used for manufacturing the in-cell transparent touch display panel provided in any one of the above described embodiments. Specifically, referring to FIG. 11, the method comprises the following steps.

Figure 11:
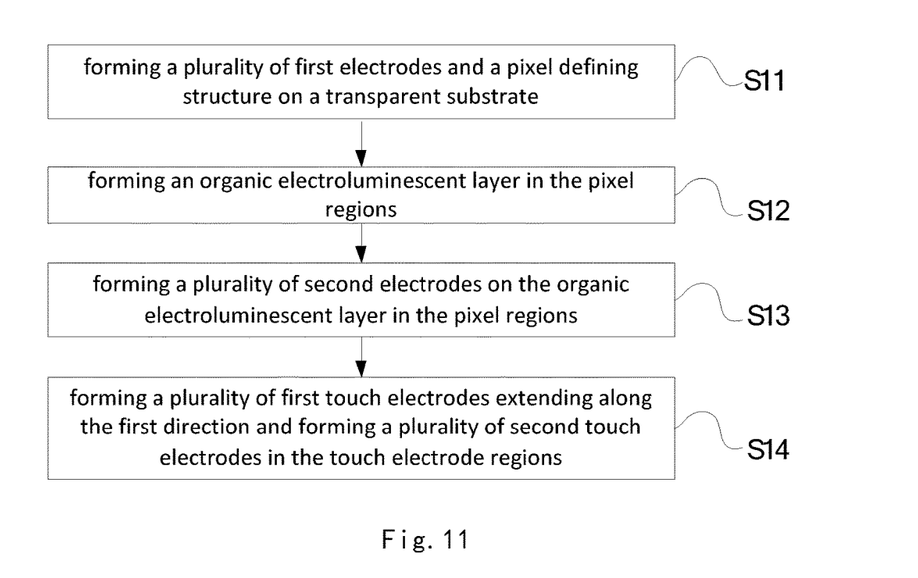
FIG. 11 is a flow chart of a method for manufacturing an in-cell transparent touch display panel provided in an embodiment of the present disclosure.

S11, forming a plurality of first electrodes and a pixel defining structure on a transparent substrate. The first electrodes extends along a first direction, the pixel defining structure defines a plurality of pixel regions and a plurality of touch electrode regions on the transparent substrate, there exists at least one pixel region between adjacent touch electrode regions.

S12: forming organic electroluminescent layer in the pixel regions. Specifically, the organic electroluminescent layers can be formed in the pixel regions and the touch electrode regions by evaporating organic electroluminescent materials. Of course, the touch electrode regions can be blocked during the evaporation so that the organic electroluminescent layers are only formed in the pixel regions.

S13: forming second electrodes on the organic electroluminescent layers in the pixel regions, the second electrodes extending along a second direction.

S14: forming a plurality of first touch electrodes extending along the first direction and forming a plurality of second touch electrodes extending along the second direction in the touch electrode regions. The first electrodes, the second electrodes, the first touch electrodes and the second touch electrodes are all made of transparent materials, and the first direction intersects with the second direction.

The in-cell transparent touch display panel obtained through the method for manufacturing an in-cell transparent touch display panel as provided in the embodiment of the present disclosure may comprise the following structures: a plurality of first electrodes extending along the first direction and a pixel defining structure on the transparent substrate, the pixel defining structure defining pixel regions and a plurality of touch electrode regions on the transparent substrate, and adjacent touch electrode regions having at least one pixel region therebetween, organic electroluminescent layers provided in the pixel regions, second electrodes arranged on the organic electroluminescent layers and in the pixel regions, the first direction intersecting with the second direction. Thus, the first electrode and the second electrode have an overlapping region, accordingly, the organic electroluminescent layers in the overlapping region can be driven for emitting light and displaying. In addition, the in-cell transparent touch display panel further comprises a plurality of first touch electrodes extending along the first direction and a plurality of second touch electrodes in the touch electrode regions and extending along the second direction, so touch control to the display panel can be achieved with the first touch electrodes and the second touch electrodes. Further, the first electrodes, the second electrodes, the first touch electrodes and the second touch electrodes are all made of transparent electrode materials, so all other regions than the overlapping regions of the first electrodes and the second electrodes can be used as light transmissive regions, i.e. the display panel provided in the embodiment of the present disclosure can be used as a transparent display panel. In summary, the embodiment of the present disclosure can integrate the in-cell touch technology into transparent OLED display panels.

In some embodiments, the first electrode and the first touch electrode are fabricated through the same one patterning process.

Specifically, the one patterning process typically includes exposing, developing, etching, stripping, etc., which are not limited herein. By forming the first electrode and the first touch electrode through the same one patterning process, the number of times of patterning process for the in-cell transparent touch display panel can be reduced, thereby simplifying the manufacturing process for the in-cell transparent touch display panel.

In some embodiments, the step of forming the pixel defining structure on the first electrodes may comprise forming a plurality of resin strips that are independent from one another along the second direction. The resin strips and the electroluminescent layers may be at the same layer. Further, the method for manufacturing an in-cell transparent touch display panel may further comprise forming a barrier on each of the resin strips along the second direction, the barrier is located between adjacent second electrodes and between adjacent second electrode and second touch electrode, so as to isolate the adjacent second electrodes or isolate the adjacent second electrode and second touch electrode.

In some embodiments, the step of forming the barrier in the above embodiment may be implemented through the following steps. S121: forming a negative photoresist film layer on the transparent substrate on which the pixel defining structure is formed. S122: arranging a mask above the negative photoresist film layer and exposing negative photoresist in other regions than those regions corresponding to the pixel defining structure. S123: developing the exposed negative photoresist film layer to form the barrier.

Considering light scattering may occur to some extent during the exposure, a cross-section of the barrier obtained through the above steps is a trapezoid whose upper base are greater than lower base thereof.

In some embodiments, the step of forming the second electrodes in the pixel regions and the step of forming the second touch electrodes in the touch electrode regions described in the above embodiments can specifically comprise evaporating an electrode material film layer on the transparent substrate on which the barrier has been formed so as to form the plurality of second electrodes and second touch electrodes.

As the barrier has a cross-section of trapezoid in the direction perpendicular to the transparent substrate, which trapezoid has an upper base greater than a lower base thereof, so in the process of evaporation, the barrier can isolate the adjacent second electrodes and the adjacent second electrode and second touch electrode to form the second touch electrodes and second electrodes. With the above embodiment, the second touch electrodes and second electrodes can be formed through one evaporating process, which can avoid the patterning process for fabricating the second touch electrodes and second electrodes, so the embodiment of the present disclosure can simplify the manufacturing process for the in-cell transparent touch display panel.

In some embodiments, the method further comprises forming a block electrode in a pixel region adjacent to the touch electrode region while forming the plurality of second electrodes and the plurality of second touch electrodes. Namely, an electrode material film layer is formed by evaporation on the transparent substrate on which the barrier is formed, so as to form the second electrodes, the second touch electrodes and the block electrode.

In some embodiments, the method further comprises forming a silver material layer in the overlapping region of the first electrode and the second electrode.

The overlapping region of the first electrode and the second electrode is the display region of the in-cell transparent touch display panel provided in the embodiment of the present disclosure, and a silver material layer covering the first electrode is provided in the display region in this embodiment, so light-transmittance of the display region can be reduced by the silver material, thereby improving display effects.

As an example, the method further comprises fabricating a protective layer covering the silver material layer. The protective layer on the silver material can protect the silver material, thereby improving reliability of in-cell transparent touch display panel.

An embodiment of the present disclosure provides a method for driving an in-cell transparent touch display panel, which is used for driving the in-cell transparent touch display panel provided in any of the above described embodiments. The method comprises the following steps: during a touch display process, dividing one frame time into a display phase and a touch phase; providing an anode drive signal to the anode electrode and providing a cathode drive signal to the cathode electrode during the display phase; providing a touch drive signal to the touch drive electrode during the touch phase.

Figure 12:
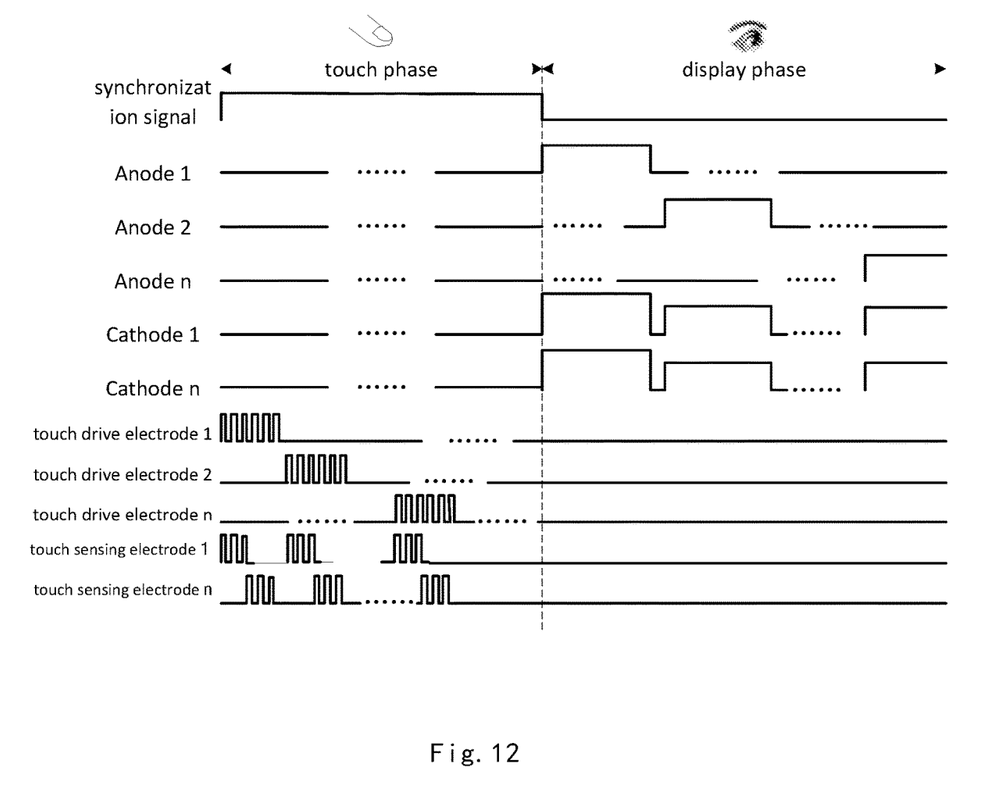
FIG. 12 shows waveforms of display drive signals and touch drive signals for the in-cell transparent touch display panel provided in an embodiment of the present disclosure.

Specifically, referring to FIG. 12, which shows waveforms of voltages of the anodes, touch drive electrodes and touch sensing electrodes of the in-cell transparent touch display panel. In the touch phase, the synchronization signal is of high level, and a grounding voltage is provided to the anodes of the in-cell transparent touch display panel, a pulsed touch drive signal is inputted to the touch drive electrodes successively, so the touch sensing electrodes sense the touch drive signal provided to the touch drive electrodes to generate pulse voltage signals, further whether a touch action occurs and where the touch action occurs are determined by detecting the pulse voltage signals on the touch sensing electrodes. In the display phase, the synchronization signal is of low level, gray-scale voltages are input to the anodes of the in-cell transparent touch display panel, and a DC voltage is input to the cathodes thereof, both the touch drive electrodes and the touch sensing electrodes are floating, and by controlling voltages to the anodes and the cathodes, it is enabled that the organic electroluminescent layers emit light and the in-cell transparent touch display panel performs displaying. By means of time-sharing driving, the display drive and the touch drive for the in-cell transparent touch display panel are separated in the above embodiment, thus avoiding interference between the touch drive signal and the display drive signal.

It shall also be noted that the anodes, cathodes, touch drive electrodes and touch sensing electrodes of the in-cell transparent touch display panel provided in any one of the above embodiments are insulated from one another, so in possible embodiments of the present disclosure, the display drive and touch drive can be carried out simultaneously.

The above described are merely specific embodiments of the present disclosure, but the scope of the invention are not so limited. Any variations or replacements that are easily conceivable by those skilled in the art under the technical scope disclosed herein shall fall into the protection scope of the invention. Therefore, the protection scope of the invention is defined by the protection scope of the appended claims.

The invention claimed is:

1. An in-cell transparent touch display panel, comprising:
   a plurality of first electrodes extending along a first direction on a transparent substrate,
   a pixel defining structure on the first electrodes, the pixel defining structure defining a plurality of pixel regions and a plurality of touch electrode regions on the transparent substrate, and adjacent touch electrode regions having at least one pixel region therebetween,
   an organic electroluminescent layer in the pixel regions, and second electrodes arranged on the organic electroluminescent layer and in the pixel regions, the second electrodes extending along a second direction, and
   a plurality of first touch electrodes extending along the first direction and a plurality of second touch electrodes extending along the second direction in the touch electrode regions,
   wherein each of the first electrodes, the second electrodes, the first touch electrodes and the second touch electrodes is transparent, and the first direction intersects with the second direction, the pixel defining structure includes a plurality of resin strips, each resin strip of the plurality of resin strips extends along the second direction,
   wherein the in-cell transparent touch display panel further comprises barriers between any two of the second electrodes and the second touch electrodes that are adjacent to each other,
   wherein each barrier extends on the resin strip along the second direction, so as to isolate adjacent second electrodes and isolate adjacent second electrode and second touch electrode.

2. The in-cell transparent touch display panel according to claim 1, wherein one of the first electrode and the second electrode is an anode, and the other of the first electrode and the second electrode is an anode is a cathode, wherein one of the first touch electrode and the second touch electrode is a touch drive electrode, and the other of the first touch electrode and the second touch electrode is a touch sensing electrode.

3. The in-cell transparent touch display panel according to claim 1, wherein a thickness of the barrier in a vertical direction perpendicular to the transparent substrate is greater than a thickness of each of the second electrode and the second touch electrode.

4. The in-cell transparent touch display panel according to claim 1, wherein a cross-section of the barrier along a direction axially perpendicular to the barrier is a trapezoid whose first base is greater than second base thereof, and the barrier contacts the pixel defining structure via the second base.

5. The in-cell transparent touch display panel according to claim 4, wherein the barrier is made from negative photoresist material.

6. The in-cell transparent touch display panel according to claim 4, wherein the barrier is made of resin material and is formed as an integral with the pixel defining structure.

7. The in-cell transparent touch display panel according to claim 1, wherein the first touch electrodes and the first electrodes are arranged in a same layer.

8. The in-cell transparent touch display panel according to claim 1, wherein the second touch electrode and the second electrode are arranged in a same layer.

9. The in-cell transparent touch display panel according to claim 1, wherein the in-cell transparent touch display panel further comprises a block electrode arranged in a pixel region neighboring the touch electrode region, the block electrode is in a same layer as the second electrode.

10. The in-cell transparent touch display panel according to claim 9, wherein an orthographic projection of the block electrode on the transparent substrate overlaps with the first touch electrode.

11. The in-cell transparent touch display panel according to claim 1, wherein the second touch electrode includes an overlap portion overlapping with the first touch electrode, and a length of the overlap portion along the first direction is smaller than that of other portion of the second touch electrode along the first direction.

12. The in-cell transparent touch display panel according to claim 1, wherein the in-cell transparent touch display panel further comprises a silver material layer on the first electrodes, which is disposed in an overlapping region between the first electrode and the second electrode.

13. The in-cell transparent touch display panel according to claim 12, wherein the in-cell transparent touch display panel further comprises a protective layer covering the silver material layer.

14. A method for manufacturing an in-cell transparent touch display panel, comprising:
forming a plurality of first electrodes and a pixel defining structure on a transparent substrate, the first electrodes extending along a first direction, the pixel defining structure defining a plurality of pixel regions and a plurality of touch electrode regions on the transparent substrate, and adjacent touch electrode regions having at least one pixel region therebetween;
forming an organic electroluminescent layer in the pixel regions;
forming second electrodes on the organic electroluminescent layer in the pixel regions, the second electrodes extending along a second direction;
forming a plurality of first touch electrodes extending along the first direction and forming a plurality of second touch electrodes extending along the second direction in the touch electrode regions;
wherein each of the first electrodes, the second electrodes, the first touch electrodes and the second touch electrodes is made of transparent material, and the first direction intersects with the second direction,
wherein the method further comprises forming a block electrode in a pixel region adjacent to one of the touch electrode regions while forming the plurality of second electrodes and the plurality of second touch electrodes, wherein the block electrode is independent from the second electrode in the pixel region and surrounded by the second electrode, wherein forming the pixel defining structure on the first electrodes comprises forming a plurality of resin strips that are independent from one another along the second direction,
wherein the method further comprises:
forming a negative photoresist film layer on the transparent substrate on which the pixel defining structure is formed;
arranging a mask above the negative photoresist film layer and exposing negative photoresist in other regions than those corresponding to the pixel defining structure;
developing the exposed negative photoresist film layer to form barriers, wherein the barriers are located between any two of the second electrodes and the second touch electrodes that are adjacent to each other, so as to isolate adjacent second electrodes and isolate adjacent second electrode and second touch electrode.

15. The method according to claim 14, wherein forming the plurality of second electrodes on the organic electroluminescent layer in the pixel regions and forming the plurality of second touch electrodes in the touch electrode regions comprise:
forming the plurality of second electrodes and the plurality of second touch electrodes by vapor depositing an electrode material film layer on the transparent substrate with the barrier formed thereon.

* * * * *